United States Patent
Kawashima et al.

(10) Patent No.: US 7,098,504 B2
(45) Date of Patent: Aug. 29, 2006

(54) NONVOLATILE SEMICONDUCTOR STORAGE DEVICE AND PRODUCTION METHOD THEREFOR

(75) Inventors: Noriyuki Kawashima, Kanagawa (JP); Kenichi Taira, Kanagawa (JP)

(73) Assignee: Sony Corporation, Tokyo (JP)

( * ) Notice: Subject to any disclaimer, the term of this patent is extended or adjusted under 35 U.S.C. 154(b) by 34 days.

(21) Appl. No.: 10/149,050

(22) PCT Filed: Sep. 28, 2001

(86) PCT No.: PCT/JP01/08493

§ 371 (c)(1),
(2), (4) Date: Jun. 5, 2002

(87) PCT Pub. No.: WO02/29902

PCT Pub. Date: Apr. 11, 2002

(65) Prior Publication Data

US 2002/0185674 A1 Dec. 12, 2002

(30) Foreign Application Priority Data

Oct. 3, 2000 (JP) ............................. 2000-303102
Nov. 15, 2000 (JP) ............................. 2000-347480

(51) Int. Cl.
  H01L 29/76 (2006.01)
  H01L 29/788 (2006.01)
  H01L 29/94 (2006.01)
  H01L 29/30 (2006.01)

(52) U.S. Cl. ...................... 257/315; 257/320; 257/314; 257/617; 257/368

(58) Field of Classification Search ................. 257/315, 257/320, 314, 390, 617, 368, 66, 386, 405, 257/396

See application file for complete search history.

(56) References Cited

U.S. PATENT DOCUMENTS 6,269,023 B1 * 7/2001 Derhacobian et al. . 365/185.24
6,418,062 B1 * 7/2002 Hayashi et al. ........ 365/185.29
6,462,374 B1 * 10/2002 Usuki et al. ................. 257/315
6,717,860 B1 * 4/2004 Fujiwara ................ 365/185.24
6,723,606 B1 * 4/2004 Flagan et al. ............... 438/264

FOREIGN PATENT DOCUMENTS

| JP | 5118782 | 6/1976 |
| JP | 5532235 | 8/1980 |
| JP | 10135357 | 5/1998 |
| JP | 11-289021 | * 10/1999 |
| JP | 11289021 | 10/1999 |

OTHER PUBLICATIONS

Jacob Killens, Utilizing Standard CMOS Process Floating Gate Devices for Analog Design, Mississipi State University, Aug. 2001, 1-38.*

"Si dot TFT Memory" Kenichi Taira, et al ,IEICE Technical Report, vol. 100, No. 3, pp. 51-56, Apr. 13, 2000, (English abstract only).

"MOS Memory Using Germanium Nanocrystals Formed by Thermal Oxidation of $Si_{1-x}Ge_x$", Ya-Chin King et al, IEDM Technical Digest, pp. 115-118.

* cited by examiner

Primary Examiner—Chuong Anh Luu
(74) Attorney, Agent, or Firm—Sonnenschein Nath & Rosenthal LLP

(57) ABSTRACT

There is provided a nonvolatile semiconductor storage device less subject to variances of electric characteristics among memory cells. A floating gate electrode provided on a substrate is made of two or more materials different in carrier trapping efficiency so as to accumulate carriers and thereby store data in the floating gate electrode. Thus a region without so large changes of the threshold voltage is produced, and the portion with a small change is used as the margin for circuit operations, thereby to eliminate variances among cells and realize high-speed operations.

18 Claims, 17 Drawing Sheets

NONVOLATILE SEMICONDUCTOR STORAGE DEVICE AND PRODUCTION METHOD THEREFOR

This Application is a 371 PCT/JP01/08493, filed Sep. 28, 2001.

BACKGROUND OF THE INVENTION

This invention relates to a nonvolatile semiconductor storage device having formed a floating gate electrode on a tunneling insulation film, and a manufacturing method thereof. Especially, the invention relates to a nonvolatile semiconductor storage device capable of storing multi-value data exceeding two values, and a manufacturing method thereof.

BACKGROUND ART

Recently, flash EEPROM capable of batch erasure is remarked as one of nonvolatile semiconductor storage devices. Each memory cell of the flash EEPROM has a MOS transistor configuration in which a floating gate electrode insulated from its peripheral elements is located between a control gate electrode and a substrate in which a channel is formed. Thus, the threshold voltage of the transistor changes with the presence or absence of an electric charge in the floating gate, and read operation is carried out in response to the change of the threshold value.

There is also a development of a technology using a multi-value memory cell that stores, in each single cell, one bit, i.e. many states more than two-value states of "0" and "1", instead of distinguishing only two states, namely ON state and OFF state, responsive to the threshold voltage of the transistor. There are some configurations of such multi-value memory cells, such as the technique disclosed in Japanese Patent Laid-Open Publication No. hei 11-14480, which makes four kinds of storage states having four kinds of threshold values, using a difference in quantity of charge stored in the floating gate electrode, and a memory cell taught in Japanese Laid-Open Publication No. hei 11-17037, which uses two floating gate electrodes formed in parallel on the channel between the source and the drain and isolated by an insulation film, and have electric charges accumulated independently in those two floating gates thereby to store multi-value data by using control electrodes provided in the floating gate electrodes, respectively.

FIGS. 1 and 2 are graphs showing changes of the threshold voltage during writing in a conventional memory cell. FIG. 1 shows that the threshold voltage is set high by increasing the writing voltage. FIG. 2 shows that the threshold voltage is set high by elongating the writing period of time. As shown in FIG. 1, the threshold voltage is divided into four values corresponding to data (00), (10), (01) and (11).

In the multi-value memory cell technique, upon actual writing of data, a verify circuit confirms whether the writing is adequate or not, and repeats the verify operation until all selected memory cells perform adequate writing. In case of the configuration obtaining four kinds of threshold voltages depending upon differences in quantity of charges accumulated in the floating gate electrode, accurate verify operation by the verify circuit is required, and this requirement may cause a scaleup of its peripheral circuits such as a sense amplifier, or invite the need of a complicated circuit. Moreover, if accurate control of the threshold voltage is not possible, then the verify operation will be repeated too much, and the substantial writing period of time will increase.

This point of problem is explained below with reference to FIG. 1. In intermediate levels of the threshold voltage (data (10) and data (01)), it is necessary to accurately apply a voltage at a point where the writing voltage rises sharply. If a slightly higher voltage is applied, then the threshold voltage shifts to the next data (01) and causes the problem of erroneous writing. Also in FIG. 2, intermediate levels, for example, require predetermined adequate ranges of the writing period of time. If data is written beyond such range, erroneous writing occurs. Additionally, if there is a variance among different memory cells, uniformity will be lost.

Multi-value memory cells having two floating gate electrodes aligned in parallel not only increase procedures of its manufacturing process, but also vary in operation among different memory cells even when the same write or erase operation is carried out due to fluctuations of the thickness of films and the channel length. Therefore, here again, accurate verify operation by a verify circuit is required, and repetition of the verify operation elongates the writing period of time.

It is therefore an object of the invention to provide a nonvolatile semiconductor storage device of a type storing data by accumulating carriers in a floating gate, which is unlikely to produce a variance of electrical properties among memory cells due to variances of the thickness of films, size or quality of films in the memory cell structural part. Especially, it is an object of the invention to provide a nonvolatile semiconductor storage device capable of carrying out storage of multi-value data exceeding two values while minimizing influences of variances among memory cells, and simultaneously shortening the writing period of time. Another object of the invention is to provide a method of manufacturing a nonvolatile semiconductor storage device having a structure resistible against such variances.

SUMMARY OF THE INVENTION

A nonvolatile semiconductor storage device according to the invention is characterized in accumulating carriers in a floating gate electrode made on a substrate and made up of at least two kinds of materials different in carrier trapping efficiency to store data.

The floating gate electrode may be a combination of a silicon oxide film having a relatively low carrier trapping efficiency and a silicon nitride film having a relatively high carrier trapping efficiency. The film having a relatively low carrier trapping efficiency can be located nearer to a carrier generation region, and the film having a relatively low carrier trapping efficiency can be located remoter from said carrier generating region. Alternatively, the floating gate electrode may have a multi-layered structure stacking those two or more kinds of material films different in carrier trapping efficiency. The floating gate electrode may be used to store two-value data, or may be configured for multi-value data storage to store more states than two values.

Another nonvolatile semiconductor storage device according to the invention is for storing data in a floating gate electrode by accumulating carriers in the floating gate electrode and thereby changing the threshold voltage, and characterized in that the threshold voltage exhibits a non-linear change including an inflection point in response to at least one of the writing voltage or the writing time.

A method of manufacturing a nonvolatile semiconductor storage device according to the invention is characterized in sequentially stacking a tunneling insulating film, a first floating gate electrode material layer, a second floating gate electrode material layer different from said first floating gate electrode material layer in carrier trapping efficiency, an inter-layer insulating layer, and a control gate electrode layer on a semiconductor substrate or on a thin-film semiconductor layer on an insulating substrate, then processing the layers from the tunneling insulating film and the control gate electrode layer into a given gate configuration, and thereafter forming source/drain regions reflecting the gate configuration on the semiconductor substrate or thin-film semiconductor layer.

In any of the nonvolatile semiconductor storage devices according to the invention, in the process of trapping carriers in the floating gate electrode made of two or more kinds of materials different in carrier trapping efficiency, the carriers first gather in one of the material layers having a relatively high carrier trapping efficiency, and when and after the material layer having a relatively high carrier trapping efficiency is going to saturate, the carriers are accumulated in the material layer having a relatively low carrier trapping efficiency. Therefore, in the transitional period where the main storage portion of carriers shift from one place to another, changes of the threshold voltage with the writing time or writing voltage do not exhibit a smooth curve, but there appears a region including an inflection point, in which the threshold voltage does not change so much with the writing time or writing voltage. In the region without so much changes of the threshold voltage with the writing time or writing voltage, the margin of the writing time or writing voltage is larger so much, and the need of accurate writing control can be eliminated.

The manufacturing method of the nonvolatile semiconductor storage device according to the invention can carry out the patterning of the first floating gate electrode material layer and the second floating gate electrode material layer different in carrier trapping efficiency simultaneously by using a common mask, and therefore remove differences in size among these layers. As a result, it is possible to provide a device having a structure resistive against variances of the writing voltage, etc. among memory cells, in conjunction with the advantage of providing the margin for the writing time or writing voltage by forming the floating gate electrode material layers different in carrier trapping efficiency.

BRIEF DESCRIPTION OF DRAWINGS

FIG. 12 shows cross-sectional views of a nonvolatile semiconductor storage device under a manufacturing process according to the fourth embodiment of the invention for the purpose of explaining its manufacturing method, in which

FIG. 13 shows cross-sectional views of the nonvolatile semiconductor storage device under the manufacturing process according to the fourth embodiment of the invention for the purpose of explaining its manufacturing method, in which

FIG. 17 shows potential diagrams of a gate portion in the nonvolatile semiconductor storage device according to the fifth embodiment of the invention, in which

DETAILED DESCRIPTION OF THE INVENTION

Some embodiments of the invention will now be explained below with reference to the drawings.

First Embodiment

Figure 3:
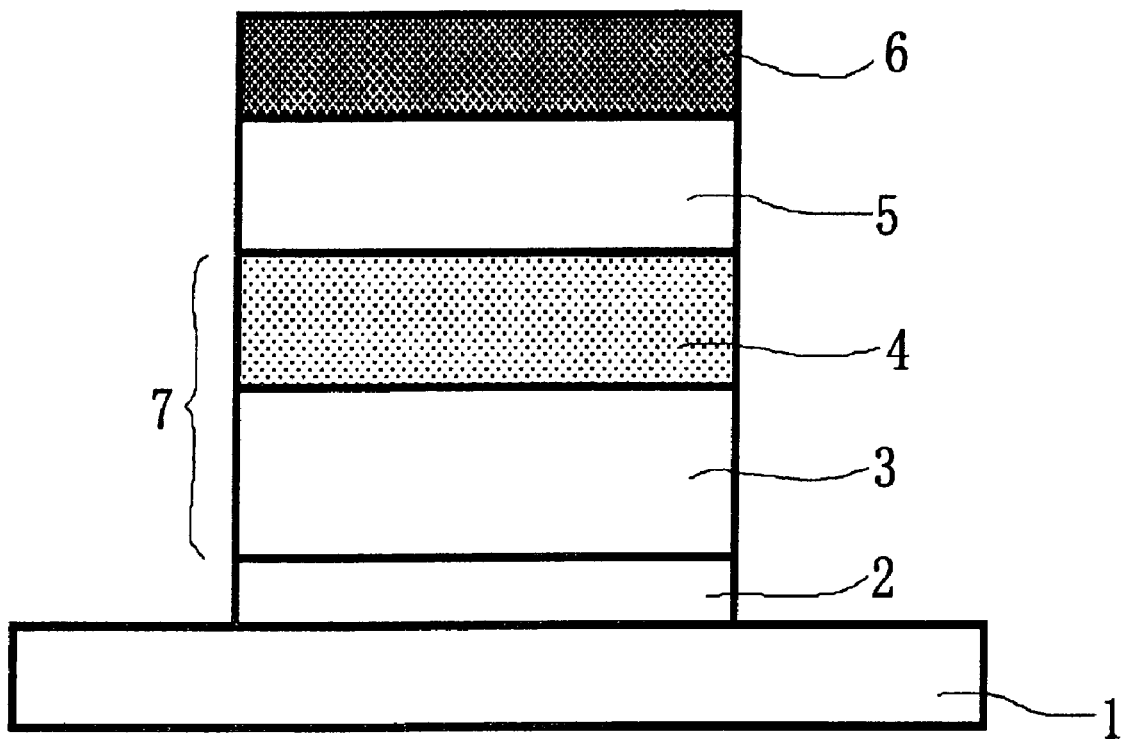
FIG. 3 is a schematic cross-sectional view of a part of a memory cell in a nonvolatile semiconductor storage device according to the first embodiment of the invention.

FIG. 3 shows a nonvolatile semiconductor storage device according to the first embodiment. FIG. 3 is a cross-sectional showing a memory cell structure of the nonvolatile semiconductor storage device. Although the nonvolatile semiconductor storage device includes a plurality of memory cells having the structure of FIG. 3, a single memory cell is explained here for simplicity.

A tunneling oxide film 2 having a thickness around 5 nm is formed on a substrate 1 by CVD, for example. Further formed thereon is a silicon oxide film 3 as a first floating gate electrode material layer and a silicon nitride film 4 as a second floating gate electrode layer. The substrate 1 may have a structure including a semiconductor thin film formed on an insulating substrate, or it may be a semiconductor single crystal substrate of silicon, for example, which will be explained later. The substrate 1 has further formed source/drain regions, not shown, in opposite side regions of the gate electrode, and the region between the source/drain regions is used as a channel region.

The silicon oxide film 3 as the first floating gate electrode material layer has a structure having fine silicon grains and/or silicon clusters separate and scatter. The silicon oxide film 3 has a thickness around 15 nm, for example. On the silicon oxide film 3 containing silicon fine grains, a silicon nitride film 4 having a thickness around 10 nm is stacked as a second floating gate electrode material layer. That is, the floating gate electrode 7 formed on the tunneling oxide film 2 is made up of a combination of the silicon oxide film 3 having a relatively low carrier trapping efficiency and the silicon nitride film 4 having a relatively high carrier trapping efficiency. The carrier trapping efficiency is a value indicating the likeliness of carriers to stack on a material layer. In case the carrier trapping cross-sectional area is used as the carrier trapping efficiency, such a combination of two different kinds of material layers may be the combination of one having a carrier trapping cross-sectional area not smaller than $10^{-12}$ cm$^2$ and the other having a carrier trapping cross-sectional area not larger than $10^{-18}$ cm$^2$.

This embodiment employs the structure stacking the silicon oxide film 3 as the first floating gate electrode material layer and the silicon nitride film 4 as the second floating gate electrode material layer. However, the first floating gate electrode material layer and the second floating gate electrode layer need not be multi-layered, but they may form a mixed structure, for example, by sectioning the floating gate region from block to block. Different kinds of material layers forming the floating gate electrode need not be two, but may be three or more.

The floating gate electrode material layers used in this embodiment are the silicon oxide film 3 and the silicon nitride film 4 containing silicon fine particles. However, in addition to this example, any combination may be employed by selecting two or more from, for example, a polycrystalline silicon film, amorphous silicon film, silicon nitride film, silicon oxide film, silicon germanium film, these films containing fine particles of silicon, germanium or silicon germanium, or their non-stoichiometric composition films. A non-stoichiometric composition film is a film having a composition deviating from the stoichiometric composition of a certain material layer. For example, in case of a silicon oxide film, non-stoichiometric composition is any composition in which contents of silicon atoms and oxygen atoms are offset from the ratio of 1:2.

Two kinds of films forming the floating gate electrode 7 may be so arranged to locate the film having a lower carrier trapping efficiency nearer to the carrier generating region and locate the film having a higher carrier trapping efficiency remoter from the carrier generating region. In this embodiment, the silicon oxide film 3 having a lower carrier trapping efficiency is stacked on the tunneling oxide film 2, and the silicon nitride film 4 having a higher carrier trapping efficiency is stacked on the silicon oxide film 3. If the film having a higher carrier trapping efficiency is located nearer to the carrier generating region, then the carriers first accumulated in the film having the higher carrier trapping efficiency will not easily move to the film having the lower carrier trapping efficiency. Therefore, it is unlikely to occur that changes of the threshold voltage with the writing voltage or writing time decrease, and such configuration is subject to influences of variances of memory cells. For example, in case the carriers are electrons, each memory cell takes an nMOS configuration, and upon writing, electrons will flow from the drain region to the floating gate electrode 7. As a result, the film having a lower carrier trapping efficiency may be located nearer to the drain, and the film having a higher carrier trapping efficiency remoter from the drain.

On the silicon oxide film 3 and the silicon nitride film 4 containing such silicon fine particles, a silicon oxide film 5 is further formed as the gate oxide film, and a control gate electrode 6 is formed on the silicon oxide film 5.

Figure 4:
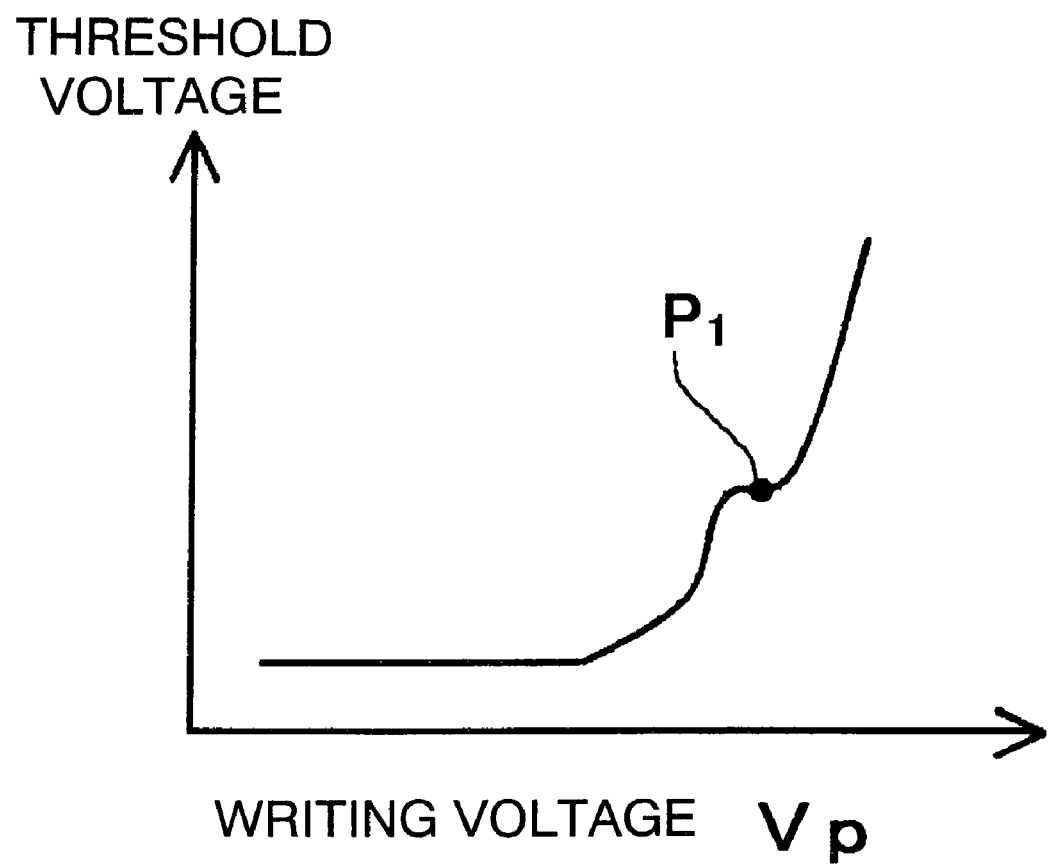
FIG. 4 is a graph showing the characteristics of a threshold voltage relative to the writing voltage in the nonvolatile semiconductor storage device according to the first embodiment of the invention.
Figure 5:
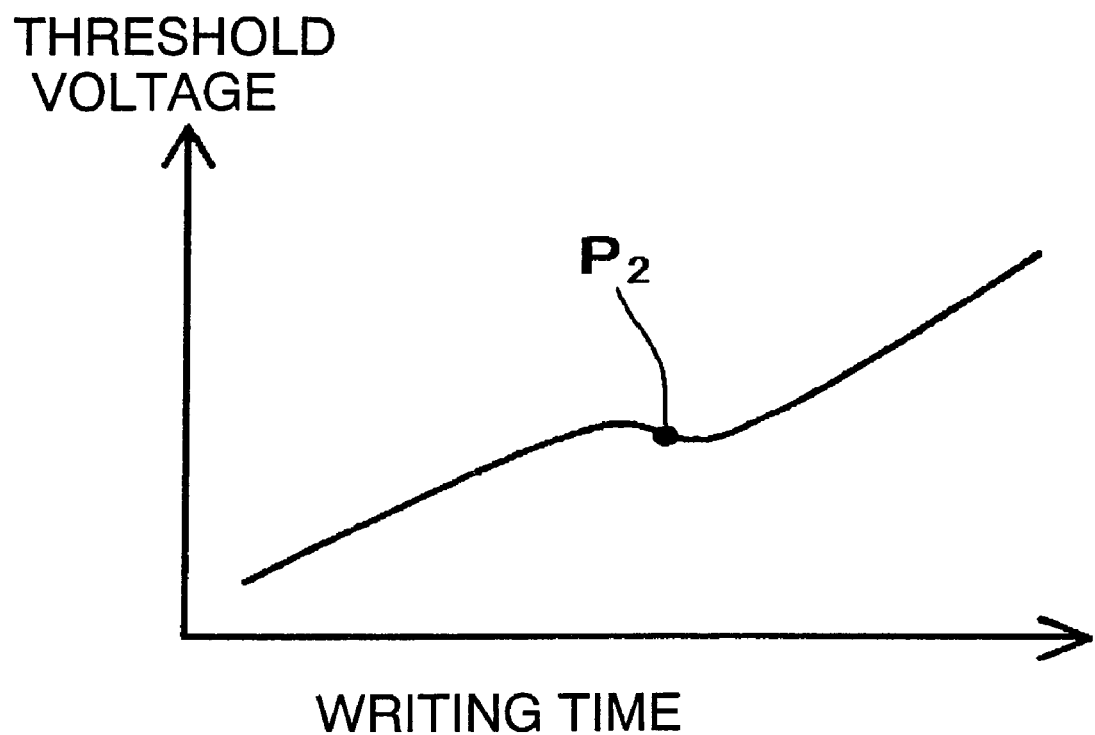
FIG. 5 is a graph showing the characteristics of the threshold voltage relative to the writing time in the nonvolatile semiconductor storage device according to the first embodiment of the invention.

FIGS. 4 and 5 are graphs showing behaviors of the nonvolatile semiconductor storage device according to the same embodiment during writing. For better understanding of the nonvolatile semiconductor storage device according to the invention, it is recommended to compare FIG. 4 with FIG. 1 explaining the conventional technique and FIG. 5 with FIG. 2 explaining the conventional technique.

In case of writing in each memory cell of the nonvolatile semiconductor storage device according to the embodiment, application of a voltage in a level of about 0 to 25 V between the source region and the control gate electrode 6 causes a Fowler-Nordheim current passing through the tunneling oxide film 2 to flow, thereby to enable injection of electrons as carriers to the floating gate electrode 7. To change the threshold voltage, a method of controlling the writing time, for example, will be acceptable, in addition to the typical method of controlling the writing voltage. In the nonvolatile semiconductor storage device according to the embodiment, any or both ways of control are effective.

As shown in FIG. 4 where the writing voltage Vp is progressively changed, the threshold voltage does not rise so much while the writing voltage Vp remains in lower values. From a certain value on, the threshold voltage relative to the writing voltage starts rising. Thereafter, there appears a region $P_1$ (shown in the figure by a representative point) where the threshold voltage does not almost change even with a further rise of the writing voltage Vp. Near the region $P_1$, the threshold voltage does not almost change even with slight changes of the writing voltage, substantially constant writing is carried out. At the same time, since this portion functions as the margin, the structure is also resistive to variances among memory cells. When the writing voltage Vp exceeds the region $P_1$ where the threshold voltage does not almost change, the threshold voltage relative to the writing voltage Vp again rises, and a high threshold voltage appears.

Figure 1:
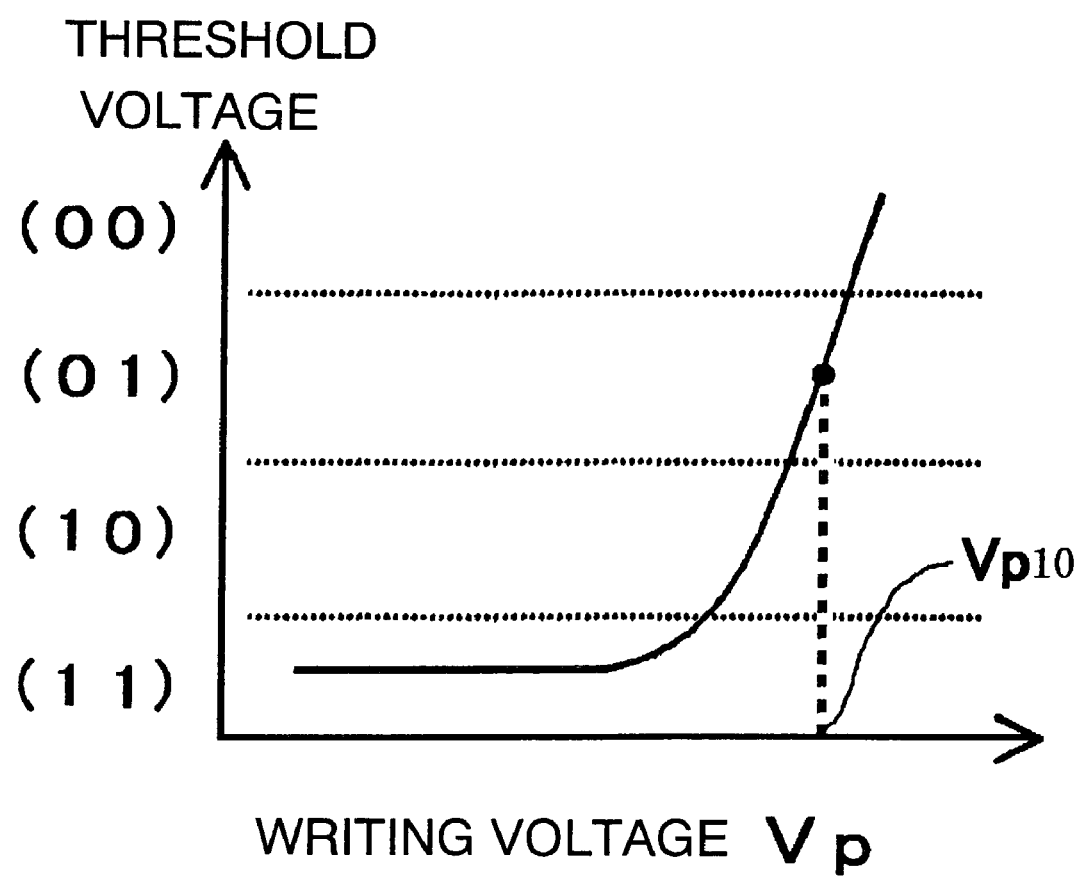
FIG. 1 is a graph showing the characteristics of a threshold voltage relative to the writing voltage in a conventional nonvolatile semiconductor storage device.
Figure 2:
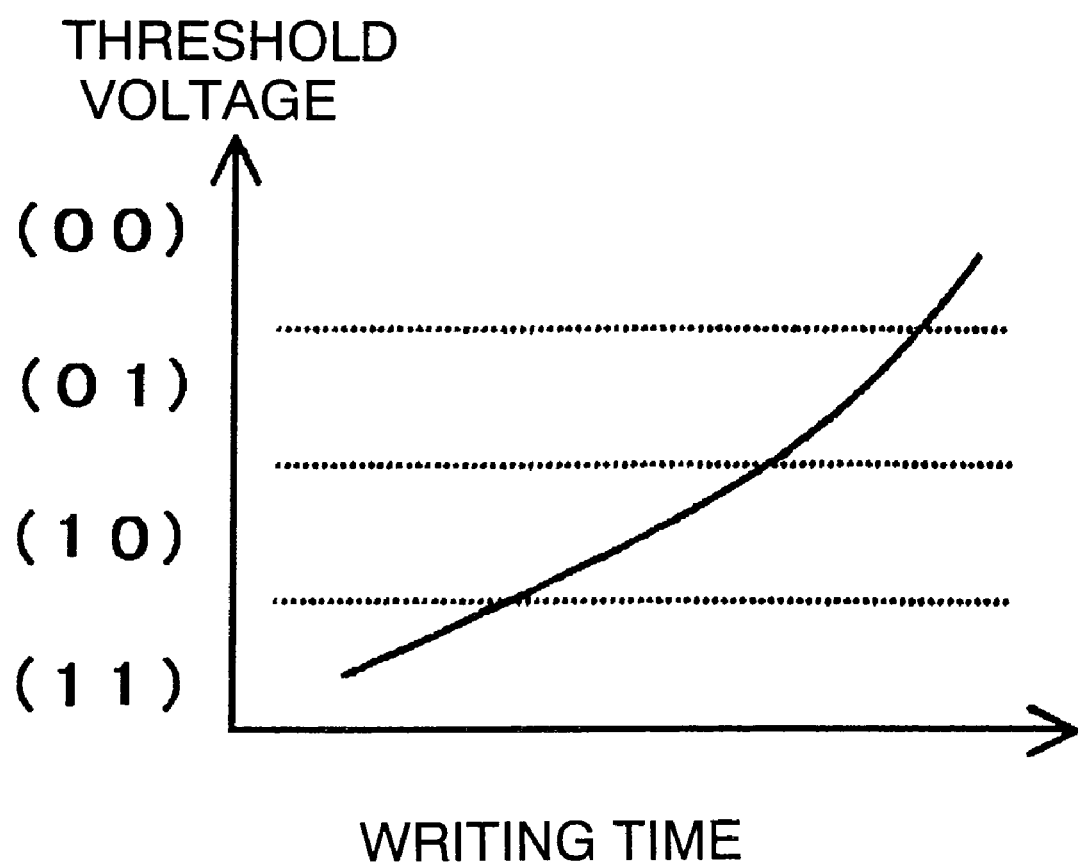
FIG. 2 is a graph showing the characteristics of the threshold voltage relative to the writing time in the conventional nonvolatile semiconductor storage device.

Appearance of the region $P_1$ with almost no changes of the threshold voltage regardless of the rising of the writing voltage Vp is an important feature of the instant embodiment, and its difference is apparent when compared with FIG. 1, i.e. the graph of the conventional one. Behaviors of carriers in the region $P_1$ are explained below although under a hypothesis. When the writing voltage Vp first rises on, electrons as carriers are accumulated more in the silicon nitride film 4 having a relatively high efficiency of trapping carriers, and only when and after the accumulated electrons starts saturating the silicon nitride film 4, the electrons move toward the silicon oxide film 3 having a relatively low efficiency of trapping carriers. The region where the main carrier trapping portion changes from the silicon nitride film 4 to the silicon oxide film 3 is just the region $P_1$ where the threshold voltage does not almost change even when the writing voltage Vp rises. The region $P_1$ is also the region giving a point of inflection to the curve of the nonlinear write characteristics, and this point of inflection is formed by behaviors of carriers.

FIG. 5 is a diagram that shows changes of the threshold voltage relative to the writing time. When the writing time is increased on, the threshold voltage gradually rises in the range where the writing time is still shorter. Thereafter, in response to the ongoing increase of the writing time, there appears the region $P_2$ (shown in the figure by a representative point) where the threshold voltage does not almost change, but rather exhibits a minus inclination. Near the region $P_2$, the threshold voltage does not change so much even with slight changes of the writing time, substantially constant writing is carried out. At the same time, since this portion functions as the margin, the structure is also resistive to variances among memory cells. When the writing time exceeds the region $P_2$ where the threshold voltage does not almost change, the threshold voltage relative to the writing time again rises, and a high threshold voltage appears.

Behaviors of carriers upon changes of the writing time can be also explained in the same manner as the behaviors of carriers upon changes of the writing voltage. That is, although it is a hypothesis, when the writing time increases, electrons as carriers are first accumulated more in the silicon nitride film 4 with a relatively higher efficiency of trapping carriers, and only when and after the accumulated electrons starts saturating the silicon nitride film 4, the electrons move toward the silicon oxide film 3 having a relatively low efficiency of trapping carriers. The region where the main carrier trapping portion changes from the silicon nitride film 4 to the silicon oxide film 3 is just the region $P_1$ where the threshold voltage does not almost change even when the writing time increases. The difference of the write characteristics relative to the time in the instant embodiment is apparent when compared with FIG. 2, i.e. the graph of the conventional one.

The nonvolatile semiconductor storage device according to the embodiment characterized in having the regions $P_1$ and $P_2$ where the threshold voltage does not change so much can be configured to operate each memory cell to store either two values similarly to the conventional one or three or more values as a multi-value memory cell. In case the memory cell is operated to store two values, the regions $P_1$ and $P_2$ can be used as threshold levels for distinguishing "0" and "1". In this case, the regions $P_1$ and $P_2$ functions as margins to clearly divide the writing voltages and the lengths of the writing time into two parts, and thereby to eliminate the need of accurate control of the writing voltage. The nonvolatile semiconductor storage device according to the instant embodiment may be either of a type configured to control multi-value memory cells or of a type in which each memory cell has a structure for storing three values including as an intermediate value the region $P_1$ or $P_2$ where the threshold voltage does not change so much. Also for the three-value memory cell, since the intermediate value, including the region $P_1$ or $P_2$ where the threshold voltage does not change so much, gives an ample margin for the writing voltage or writing time, the writing voltage need not be accurately controlled, similarly to the two-value memory cell.

Figure 6:
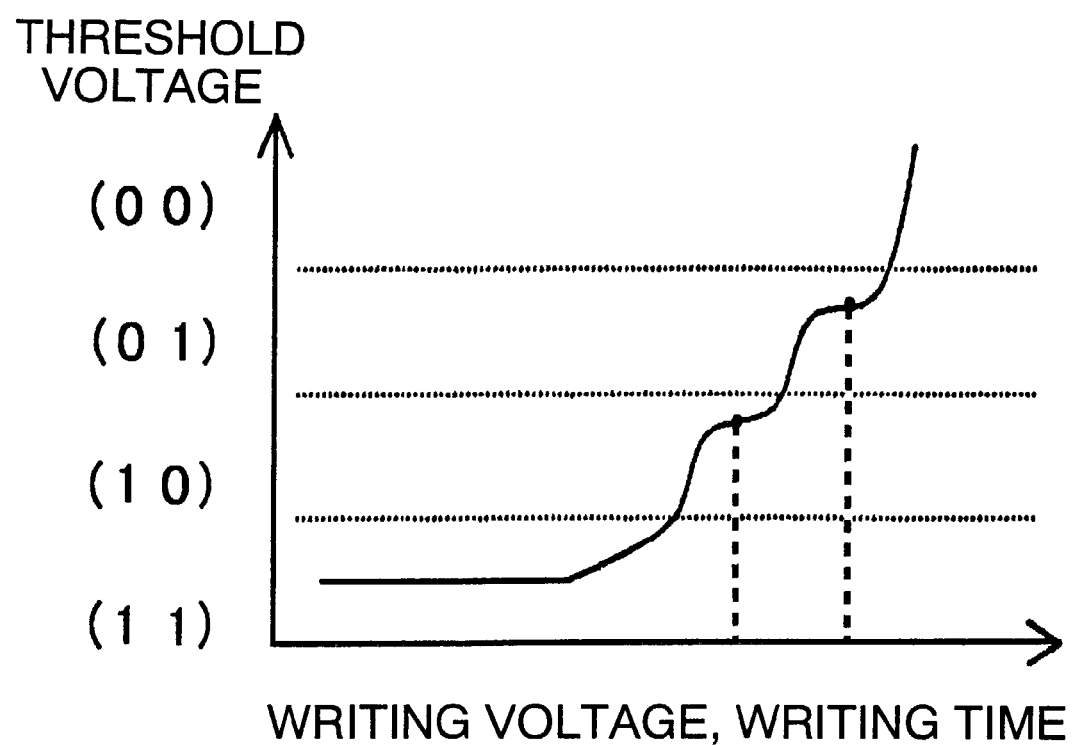
FIG. 6 is a graph showing the characteristics of the threshold voltage relative to the writing voltage or the writing time in a nonvolatile semiconductor storage device according to the invention configured to store four-value data.

The nonvolatile semiconductor storage device according to the embodiment is not limited to three values, but can be configured to deal with four values of (11), (10), (01) and (00) different in level depending on the threshold voltage, for example, as shown in FIG. 6, by combining several kinds of material layers different in carrier trapping efficiency. That is, as shown in FIG. 6, the use of two regions without so much changes of the threshold voltage leads to realization of four-value memory cells. Not only such combination of several kinds of material layers different in carrier trapping efficiency but also a contrivance of positions, thicknesses or stacked structure of material layers different in carrier trapping efficiency, use of a layer enhancing or diminishing the carrier trapping performance or introduction of impurities, or optimization of the control voltage will enable realization of four-value memory cells. Even in case of making the memory cells be available for four or more values, since the intermediate values including regions without so much changes of the threshold voltage give an ample margin for the writing voltage or writing time, the writing voltage need not be accurately controlled similarly to two-value memory cells, and uniform write operation can be readily carried out.

Figure 7:
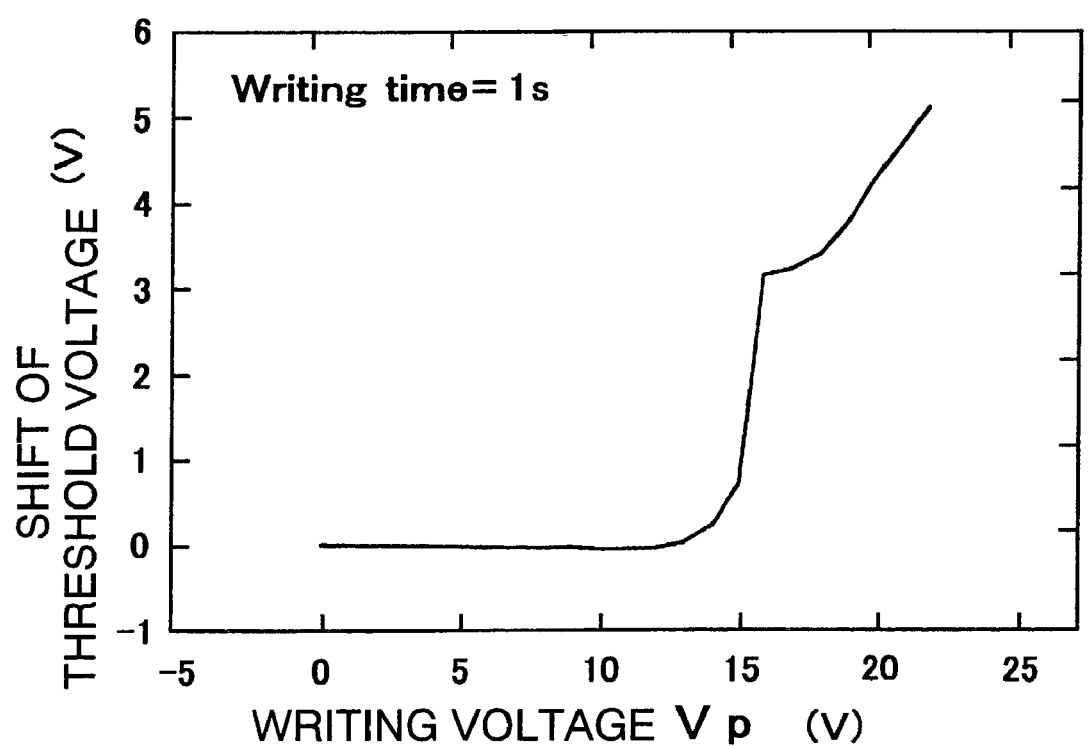
FIG. 7 is a graph showing the characteristics of a threshold voltage relative to the writing voltage according to data obtained by an experiment for checking operations with the nonvolatile semiconductor storage device according to the first embodiment of the invention.
Figure 8:
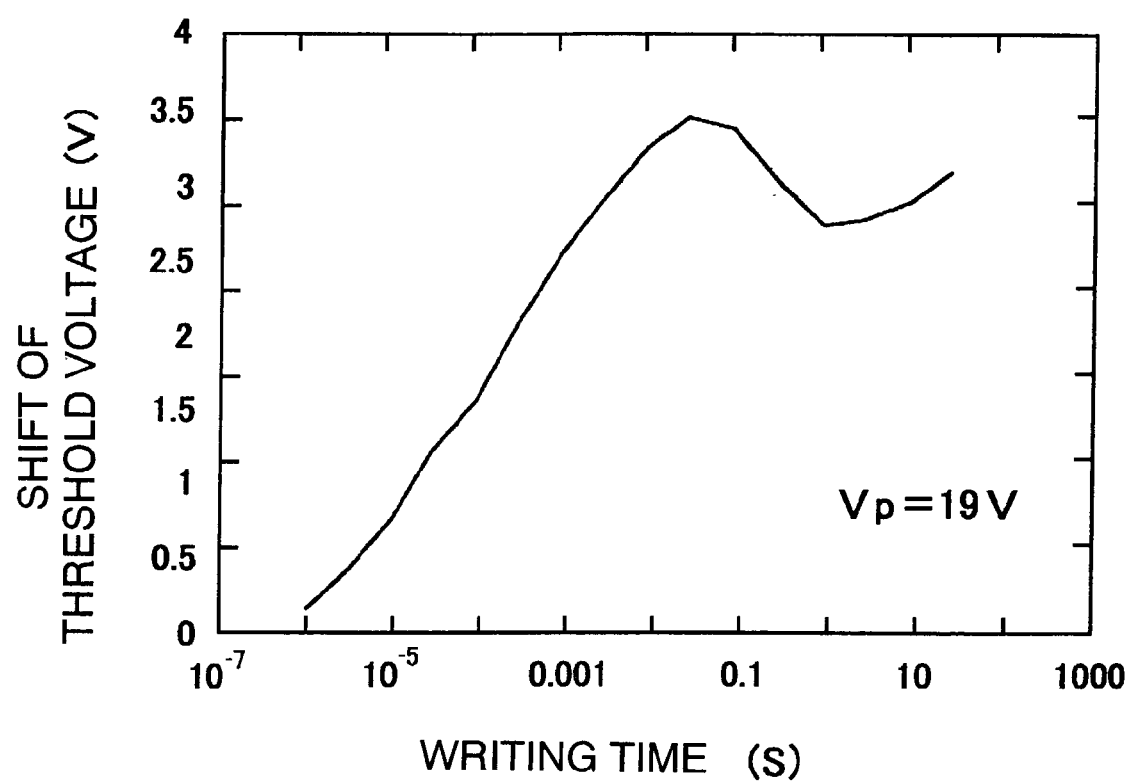
FIG. 8 is a graph showing the characteristics of a threshold voltage relative to the writing time according to data obtained by an experiment for checking operations with the nonvolatile semiconductor storage device according to the first embodiment of the invention.

The Inventors of the present application carried out experiments for confirming operations of the nonvolatile semiconductor storage device according to the instant embodiment, and their results are shown in FIGS. 7 and 8. Memory cells of the storage device used for the experiments have the structure shown in FIG. 3. That is, a silicon oxide film as the first floating gate electrode material layer and a silicon nitride film as the second floating gate electrode material layer are stacked on a tunneling oxide film, and a control gate electrode is further formed via a gate oxide film. The silicon oxide film as the first floating gate electrode material layer contains silicon fine particles.

FIG. 7 is a graph showing results of an experiment carried out by gradually changing the writing voltage Vp. This graph of characteristics relative to the writing voltage was obtained by fixing the writing time to one second and measuring the shifting of the threshold voltage in voltage value. The result shows that the shifting amount of the threshold voltage suddenly increases near 15 V of the writing voltage and reaches the shifting amount of 3 V. There appears, however, a region where the (shifting amount of the) threshold voltage does not change so much from that value up to approximately 18V of the writing voltage. Then, in the region beyond 18V of the writing voltage, the shifting amount of the threshold voltage again increases with the rise of the writing voltage. Also in this experiment for checking operations, the region without so much changes of the threshold voltage relative to writing voltage has been confirmed in the nonvolatile semiconductor storage device according to the instant embodiment.

FIG. 8 shows a shifting amount of the threshold voltage obtained when the writing time changes. This graph of characteristics relative to the writing voltage was obtained by fixing the writing voltage to 19V and measuring changes of the threshold voltage in voltage value. The result shows that the shifting amount of the threshold voltage increases approximately linearly along with the increase of the writing time approximately until the writing time exceeds 0.01 second. Thereafter, however, until reaching the region of approximately 1 second, the shifting amount of the threshold voltage relative to the writing time does not increase but rather decreases. Then, in the region where the writing time exceeds approximately one second, the shifting amount of the threshold voltage again increases. Regarding behaviors relative to the writing voltage, the existence of the region where the threshold voltage changes with a minus inclination, that is, the region where the threshold voltage decreases, has been confirmed as one type of regions without so much changes of the threshold voltage.

Figure 9:
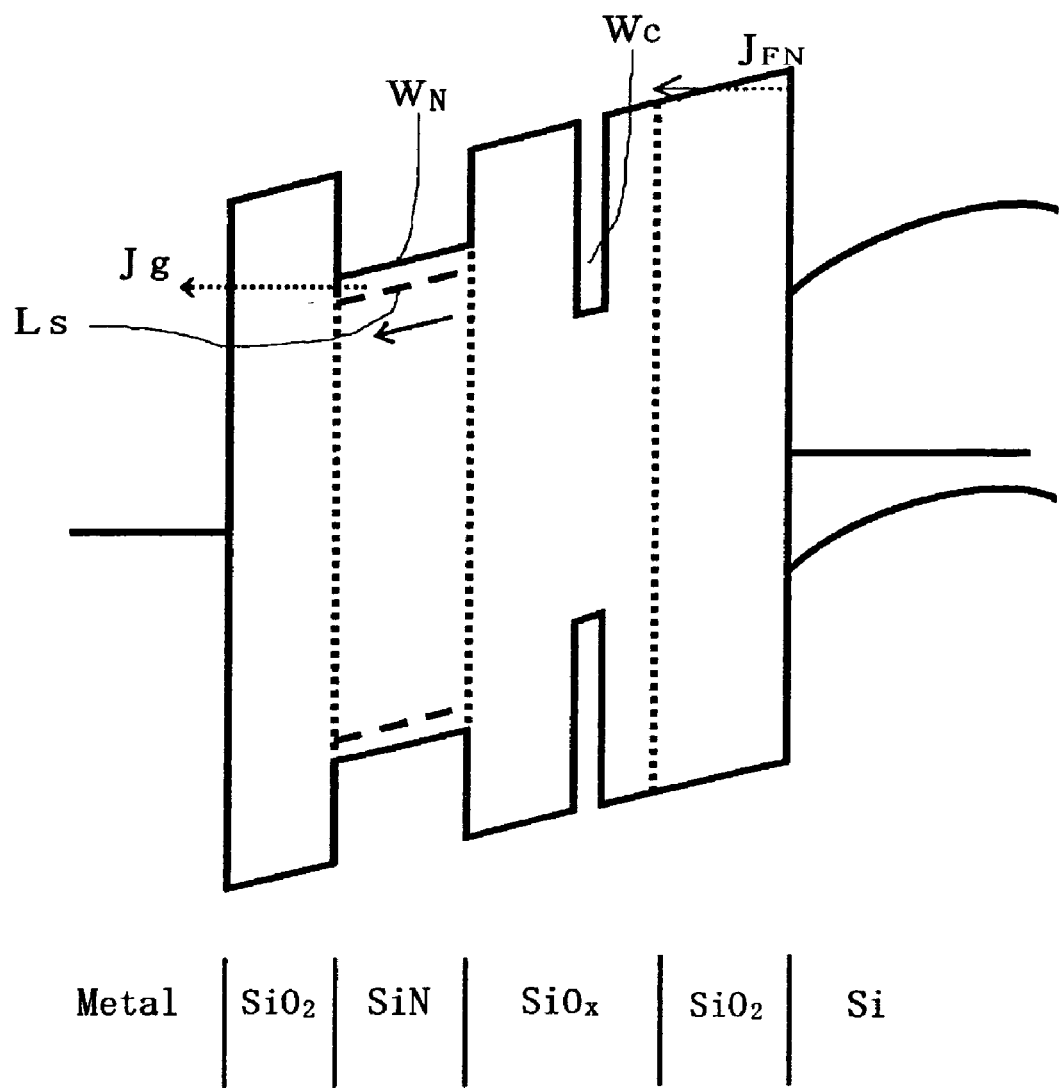
FIG. 9 is a potential diagram of a gate portion in the nonvolatile semiconductor storage device according to the first embodiment of the invention.

Although it is a hypothesis, an explanation will be added below regarding the fact that the shifting amount of the threshold voltage relative to the writing time does not increase but rather decreases in a region. FIG. 9 is a potential diagram of a memory cell structure taken along its cross-sectional direction. FIG. 9 illustrates the tunneling oxide film ($SiO_2$) as a potential barrier portion adjacent to silicon (Si). In a writing operation, electrons tunneling the tunneling oxide film as shown by the arrow $J_{FN}$ in FIG. 9 and passing through a silicon oxide film ($SiO_x$) reach the silicon nitride film (SiN) having the potential $W_N$ and are accumulated there. The potential $W_C$ is that of the silicon fine particles. When electrons are trapped in the trap level Ls of the silicon nitride film (SiN), the potential of the silicon nitride film responsively rises, and the injection current ($J_{FN}$) decreases accordingly. Therefore, a region exists where changes of the threshold voltage are governed by re-distribution of electrons in the silicon nitride film rather than trapping of electrons. That is, since the trapped electrons are re-distributed toward the gate, the threshold voltage temporarily decreases. An alternative assumption is such that the rise of the potential of the silicon nitride film enhances the electric field applied to the gate oxide film, and deprival of the trapped electrons toward the gate by a current Jg decreases the threshold voltage.

As explained above, in the nonvolatile semiconductor storage device according to the instant embodiment, the floating gate electrode made of two kinds of materials different in carrier trapping efficiency generates a region without so much changes of the threshold voltage relative to changes of the writing voltage, and upon changes of the writing time while a predetermined voltage is applied, there exists a region where the threshold voltage rather decreases. Therefore, the use of the memory cell structure combining floating gate electrode made of two or more kinds of materials different in carrier trapping efficiency eliminates the need of accurately controlling the writing voltage, and uniform writing operation can be easily carried out. In other words, that configuration makes easy to provide an operation margin that permits variances among memory cells to be disregarded in the normal circuit operation, and diminishes the size and the load of the peripheral circuit to enable high-speed writing simultaneously.

Second Embodiment

Next referring to FIG. 10, a nonvolatile semiconductor storage device according to the second embodiment will be explained. This nonvolatile semiconductor storage device has formed a plurality of memory cells each having the structure shown in FIG. 10. For simplicity, however, a single memory cell is taken for explanation.

Figure 10:
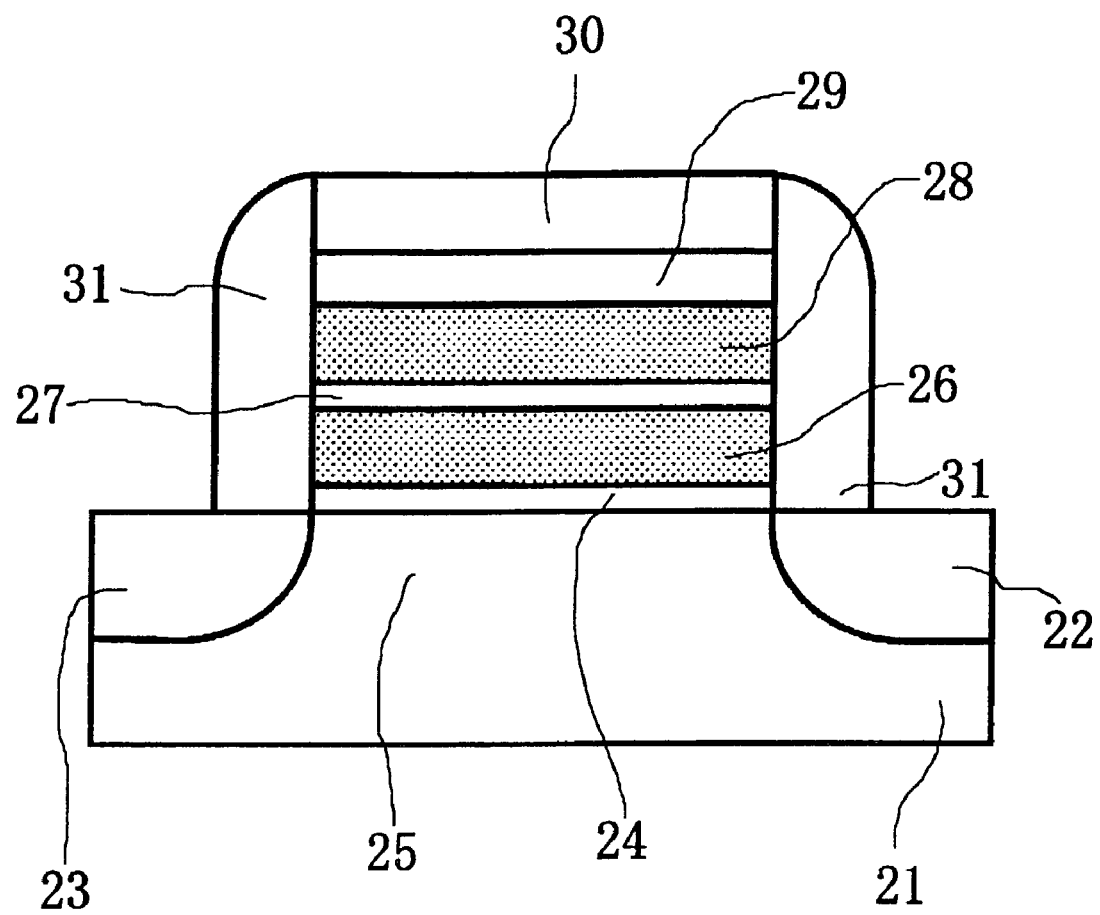
FIG. 10 is a schematic cross-sectional view of a part of a memory cell in a nonvolatile semiconductor storage device according to the second embodiment of the invention.

As shown in FIG. 10, stacked on the surface of a semiconductor substrate 21 of monocrystal silicon, for example, is a polycrystalline silicon film 26 as the first floating gate electrode via a 10 nm thick tunneling oxide film 24 formed by thermal oxidation, and a silicon nitride film 28 as the second floating gate electrode via a 10 nm thick silicon oxide film 27. In this multi-layered structure, the polycrystalline silicon film 26 make up material layers different in carrier trapping efficiency. Further formed on the silicon nitride film 28 is a control electrode 20 via a silicon oxide film 29. This control electrode 30 is for a writing voltage or an erasing voltage to the substrate 21 or the source/drain regions 22, 23.

It is formed by patterning a polycrystalline silicon layer, for example. Alternatively, a tungsten silicide film may be formed.

The source/drain regions 22, 23 are formed in self alignment with the gate electrode by a method like ion implantation of an n-type dopant, such as phosphorus or arsenic after the gate portion is formed on the surface of the semiconductor substrate 21, and the surface portion of the semiconductor substrate 21 between the source/drain regions 22, 23 will serve as a channel region 25. On side walls of the multi-layered structure from the control electrode 30 to the tunneling oxide film 24 involved, side walls 31, 31 are formed by first forming silicon oxide films on the entire surface by CVD, for example, and then etching the silicon oxide films by RIE (reactive ion etching). Although not shown, openings are formed in the source/drain regions 22, 23 to extract the electrodes.

In the nonvolatile semiconductor storage device having the above-explained structure according to the instant embodiment, the polycrystalline silicon film 26 and the silicon nitride film 28 are used as at least two materials of the floating gate electrode different in carrier trapping efficiency. When the writing voltage is raised, electrons as carriers are first accumulated in the film having a higher carrier trapping efficiency, and only when and after the film having the higher carrier trapping efficiency starts saturated, the electrons gather in the film having a lower carrier trapping efficiency. Similarly to the first embodiment, since there appears a region with almost no changes of the threshold voltage and that region functions as a margin for writing, reliable writing is carried out without accurate control of the writing voltage. It results in simplifying the configuration of the verify circuit and in realization of substantially high-speed writing.

For writing, while adjusting the potential of the semiconductor substrate 21 or the potential of the source region to 0V (ground potential), a voltage around 12V may be applied to the control electrode 30. When the control electrode 30 receives the voltage of 12V, a Fowler-Nordheim current flows from the substrate toward the floating gate electrode, and electrons are injected to the polycrystalline silicon film 26 and the silicon nitride film 28, respectively. Alternatively, by applying 5V to the control electrode 30 and the drain region 23, respectively, while grounding the source region 22, writing by hoot electrons may be carried out.

When such writing is carried out, the same writing characteristics as those shown in FIGS. 4 and 5 can be obtained. That is, in the writing characteristics of the instant embodiment, a region with almost no changes of the threshold voltage functions as a margin for writing. Thus the configuration of the instant embodiment ensures reliable writing without accurate control of the writing voltage, and facilitates the configuration of the verify circuit, thereby to realize substantially high-speed writing.

In addition, since the polycrystalline silicon film 26 and the silicon nitride film 28 used as material layers different in carrier trapping efficiency have the same electrode shape and are patterned by using the same photolithographic mask. Therefore, there is no dimensional difference between the polycrystalline silicon film 26 and the silicon nitride film 28, and this contributes to further stabilization of the memory cell operation.

The embodiment has been explained as using the polycrystalline silicon film 26 and the silicon nitride film 28 as two kinds of material layers different in carrier trapping efficiency. However, other combinations are also acceptable. For example, in lieu of, or in addition to, the polycrystalline silicon film and the silicon nitride film, an amorphous silicon, a film containing silicon fine particles in an insulating film, silicon-germanium film, and the like, can be used. A plurality of silicon nitride films or silicon oxide films can be also used as different material layers of the floating gate electrode provided they are different in trapping cross-sectional area or trapping density due to a difference of the film quality. Furthermore, the nonvolatile semiconductor storage device according to the instant embodiment can be designed as a multi-value memory cell configuration for four or more values by combining several kinds of material layers different in carrier trapping efficiency.

Third Embodiment

The nonvolatile semiconductor storage device according to the instant embodiment is an example using TFT (thin film transistor) type memory cells as explained below with reference to FIG. 11.

Figure 11:
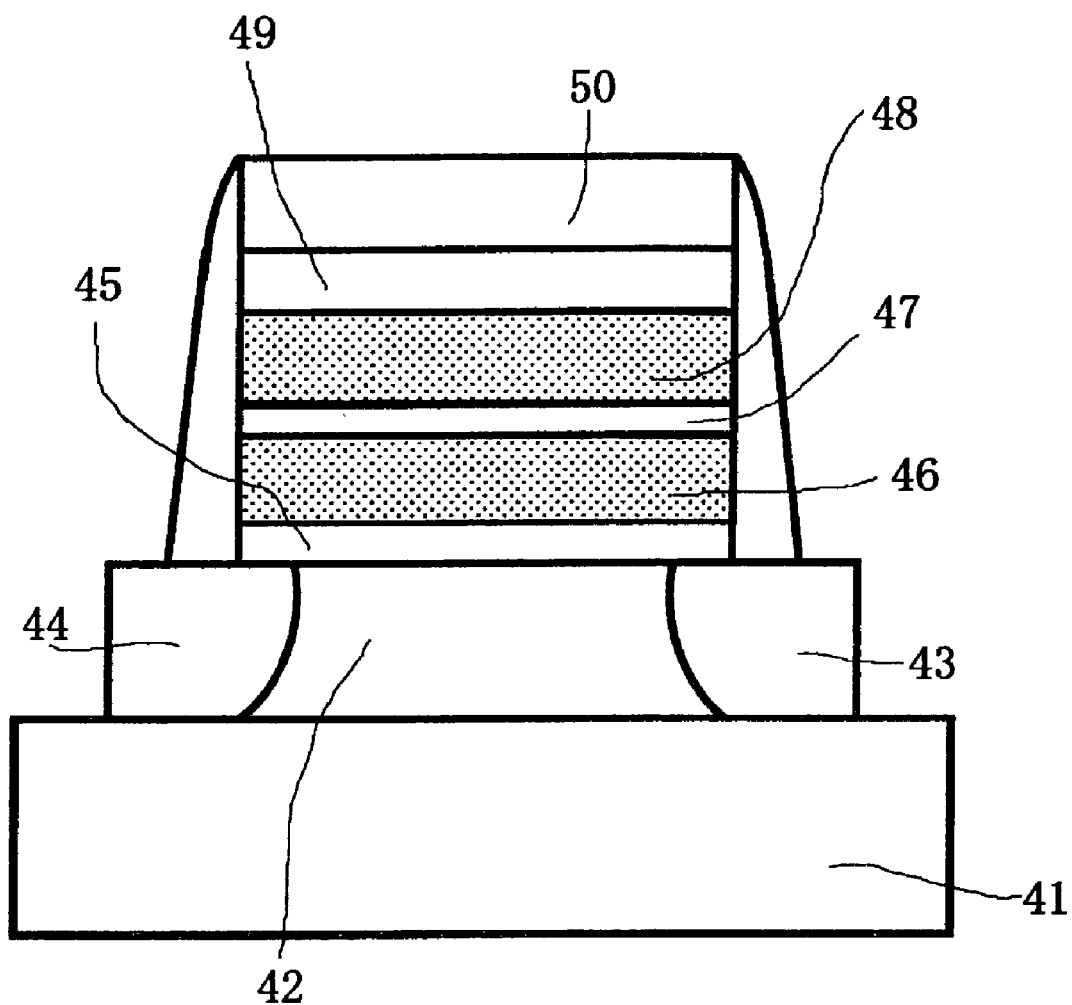
FIG. 11 is a schematic cross-sectional view of a part of a memory cell in a nonvolatile semiconductor storage device according to the third embodiment of the invention.

FIG. 11 is a cross-sectional view of a memory cell portion of the nonvolatile semiconductor storage device according to the third embodiment. A crystallized thin film semiconductor layer 42 is formed on the surface of an insulating substrate 41 of an insulating material such as quartz, sapphire or glass, and a tunneling oxide film 45 is formed thereon by CVD. Similarly to the second embodiment, a polycrystalline silicon film 46 as the first floating gate electrode is stacked on the tunneling oxide film 45, and a silicon nitride film 48 as the second floating gate electrode is stacked thereon via a 10 nm thick silicon oxide film 47. In this multi-layered structure, the polycrystalline silicon film 46 and the silicon nitride film 48 constitute material layers different in carrier trapping efficiency. A control electrode 50 is further formed on the silicon nitride film 48 via a silicon oxide film 49. The control electrode 50 is used to apply a writing voltage or erasing voltage to the source/drain regions 43, 44. It can be made by patterning a polycrystalline silicon layer. Alternatively, a tungsten silicide film may be formed.

Similarly to the second embodiment, the source/drain regions 43, 44 are formed in self alignment with the gate electrode by, for example, ion implantation of an n-type dopant such as phosphorus or arsenic, and the surface portion of the thin film semiconductor layer 42 between the source/drain regions 43, 44 is used as a channel region. On side surfaces of the structure from the control electrode 50 to the tunneling oxide film 45, side walls are formed by first forming silicon oxide films on the entire side surfaces by CVD and thereafter etching them by RIE (reactive ion etching). The source/drain regions 43, 44 have formed openings, not shown, for extraction of the electrodes.

Similarly to the second embodiment, the nonvolatile semiconductor storage device having the above-explained configuration according to the instant embodiment also uses the polycrystalline silicon film 46 and the silicon nitride film 48 as two kinds of material layers of the floating gate electrode different in carrier trapping efficiency. When the writing voltage is raised, electrons as carriers are first accumulated in the film having the higher carrier-trapping efficiency. Only when the film having the higher carrier-trapping efficiency starts saturating, the electrons gather in the film having the lower carrier-trapping efficiency. Since a region with almost no changes of the threshold voltage appears and functions as the margin for writing, similarly to the first embodiment, reliable writing is ensured without accurate control o the writing voltage. It also contributes to simplifying the configuration of the verify circuit and to realization of substantially high-speed writing.

The nonvolatile semiconductor storage device according to the third embodiment having a TFT configuration is especially effective when integrally formed with other elements using TFT on a common substrate. In case it is formed on an insulating substrate 41 of glass or quartz, for example, an amorphous silicon film is first formed by CVD or other appropriate method, and it is next crystallized by high-temperature annealing in a nitrogen atmosphere or excimer laser annealing, for example. The crystallized thin-film semiconductor layer 42 is then processed by RIE, for example, for isolation of devices, and after the tunneling oxide film 45 is formed by CVD, for example, the polycrystalline silicon film 46, silicon oxide film 47 and silicon nitride film 48 are formed, and the silicon oxide film 49 and the control electrode 50 are stacked.

Since the polycrystalline silicon film 46 and the silicon nitride film 48 used as the material layers different in carrier trapping efficiency have the same electrode shape, and are patterned by using the common photolithographic mask, no difference in size is produced between the polycrystalline silicon film 46 and the silicon nitride film 48, and the memory cell operation can be further stabilized.

Although the embodiment explained above uses the polycrystalline silicon film 46 and the silicon nitride film as two kinds of material layers different in carrier trapping efficiency, other combinations with other material layers are also possible. For example, in addition to, or in lieu of, the polycrystalline silicon film and/or the silicon nitride film, an amorphous silicon film, an insulating film containing silicon fine particles, a silicon germanium film, and so on, can be used. Common silicon nitride films or common silicon oxide films are also usable as different material layers forming the floating gate electrode provided they are different in trapping cross-sectional area or trapping density caused by a difference in film quality. Additionally, the nonvolatile semiconductor storage device according to the instant embodiment can be designed to have a multi-memory configuration for four or more values by combining several kinds of material layers different in carrier trapping efficiency.

Fourth Embodiment

The fourth embodiment is an example of a manufacturing method of a nonvolatile semiconductor storage device, especially for manufacturing one having a silicon oxide film containing silicon fine particles. This embodiment is explained in the order of its steps with reference to FIGS. 12A through 12C, 13A and 13B.

Figure 12A:
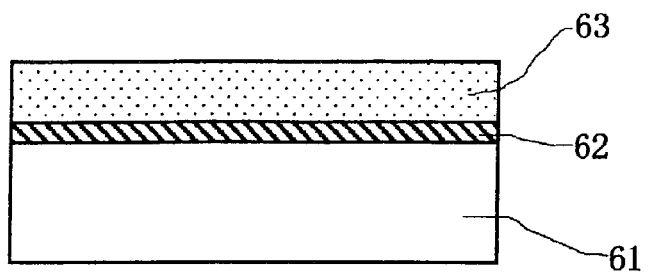
FIG. 12A shows that up to the step of forming a silicon oxide film.

First referring to FIG. 12A, a p-type single crystal silicon substrate 61 is processed by LOCOS for isolation of devices, and a tunneling oxide film 62 is formed on the major surface of the silicon substrate 61 by thermal oxidation. After that, a silicon oxide film 63 of a non-stoichiometric composition is stacked by CVD.

Figure 12B:
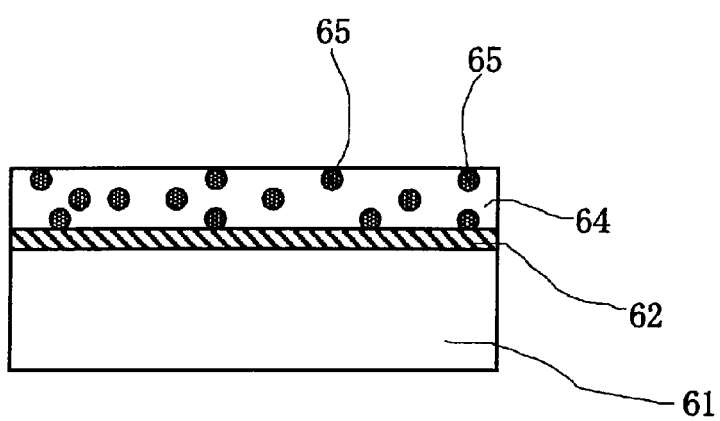
FIG. 12B shows that up to the step of forming silicon fine particles.

After that, as shown in FIG. 12B, just after the silicon oxide film 63 of the non-stoichiometric composition is stacked, it is annealed in a nitrogen atmosphere held at 800° C. through 1000° C. As a result of the annealing, silicon fine particles 65 in the order of several nanometers precipitate in the silicon oxide film 64. The silicon oxide film 64 containing the silicon fine particles 65 functions as the first floating gate electrode.

Figure 12C:
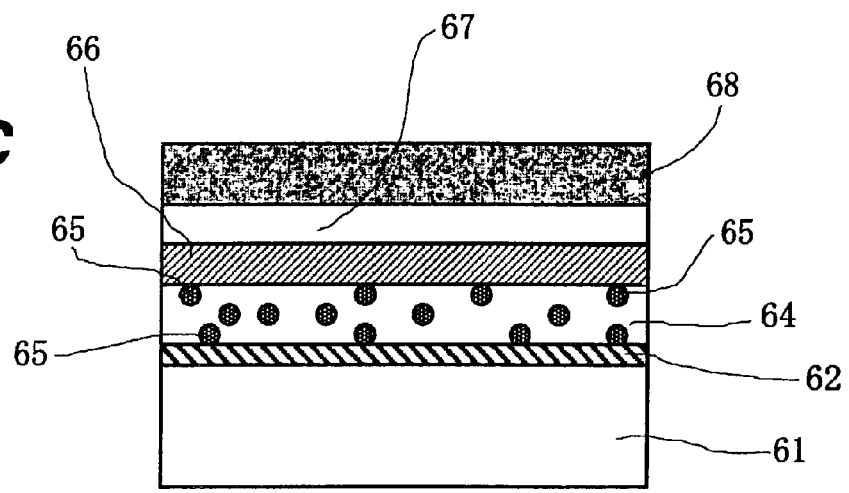
FIG. 12C shows that up to the step of forming an electrode layer.

As shown in FIG. 12C, a silicon nitride film 66 is further stacked on the silicon oxide film 64 containing the silicon fine particles 65. Although the silicon nitride film 66 is formed, for example, by CVD, another silicon nitride film 66 having a different quality can be formed by changing the flow rate and/or other factors of the source material gas SiH$_4$/NH$_3$ in the CVD process. Therefore, two or more silicon nitride films different in film quality and hence in carrier trapping efficiency can be formed and used as the floating gate electrode by controlling the flow rate. After the silicon nitride film 66 is formed, a silicon oxide film 67 is further formed, and an electrode layer 68 forming the control gate electrode is next formed.

Figure 13A:
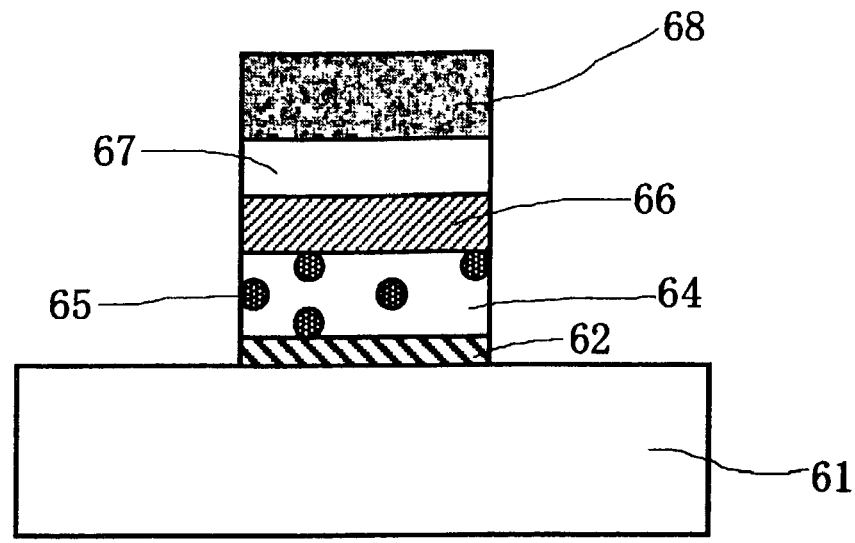
FIG. 13A shows that up to the step of patterning a gate electrode.

FIG. 13A shows the patterning of the gate electrode. The tunneling oxide film 62, silicon oxide film 64 containing silicon fine particles 65, silicon nitride film 66, silicon oxide film 67 and electrode layer 68 are cut into equally sized parts by RIE, for example. Since the silicon oxide film 64 containing the silicon fine particles 65 and the silicon nitride film 66, which are material layers different in carrier trapping efficiency, have the same electrode shape and are patterned by using a common photolithographic mask, the silicon oxide film 64 and the silicon nitride film 66 are equal in size, and can further stabilize the operation of the memory cell.

Figure 13B:
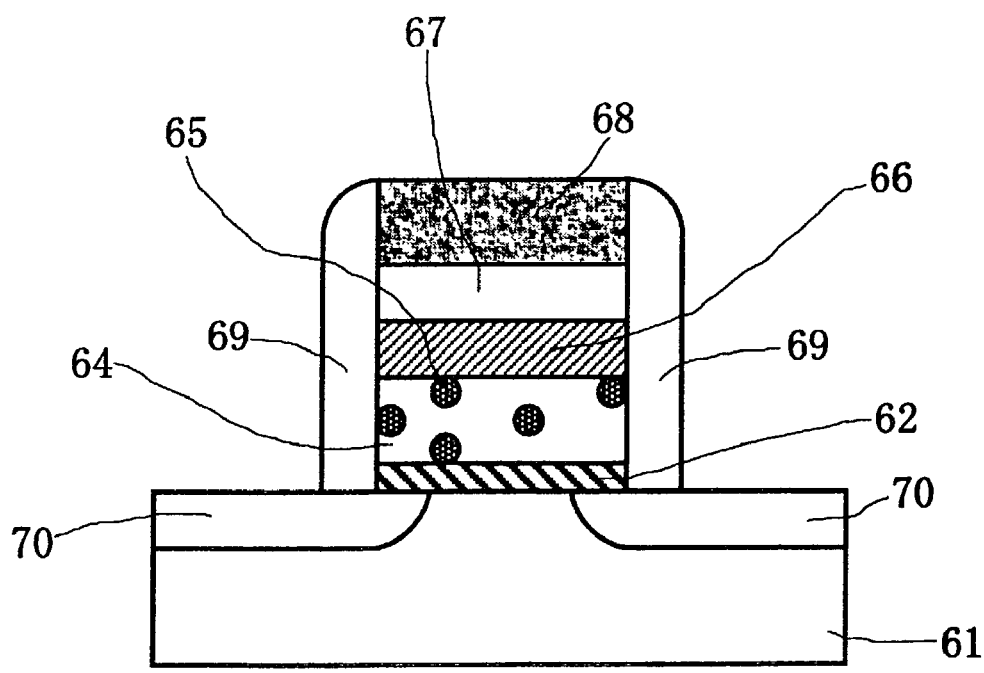
FIG. 13B shows that up to the step of forming a sidewall.

In FIG. 13B, an n-type dopant such as phosphorus or arsenic is introduced to the surface of the silicon substrate 61 to form source/drain regions 70, 70 in self alignment with the gate electrode. After that, an insulating film is formed on the entire surface by CVD, and it is selectively etched by RIE to form sidewalls 69 on side surfaces of the floating gate electrode. Finally, the source/drain regions 70, 70 are buried, and an electrode of a given pattern, not shown, is attached to complete he memory cell.

The manufacturing method of the nonvolatile semiconductor storage device according to the instant embodiment can form the floating gate electrode of two kinds of materials different in carrier trapping efficiency by using an existing technique, and the nonvolatile semiconductor storage device thus obtained can use the regions with almost no changes of the threshold voltage by those two kinds of materials different in carrier trapping efficiency as the margin for writing. Therefore, reliable writing is ensured without strict control of the writing voltage, and this results in simplifying the configuration of the verify circuit and realization of substantially high-speed writing.

Additionally, since the silicon oxide film 64 containing the silicon fine particles 65 and the silicon nitride film 66, which are material layers different in carrier trapping efficiency, have the same electrode shape and are patterned by using a common photolithographic mask, the silicon oxide film 64 and the silicon nitride film 66 are equal in size, and can further stabilize the operation of the memory cell.

Fifth Embodiment

Figure 14:
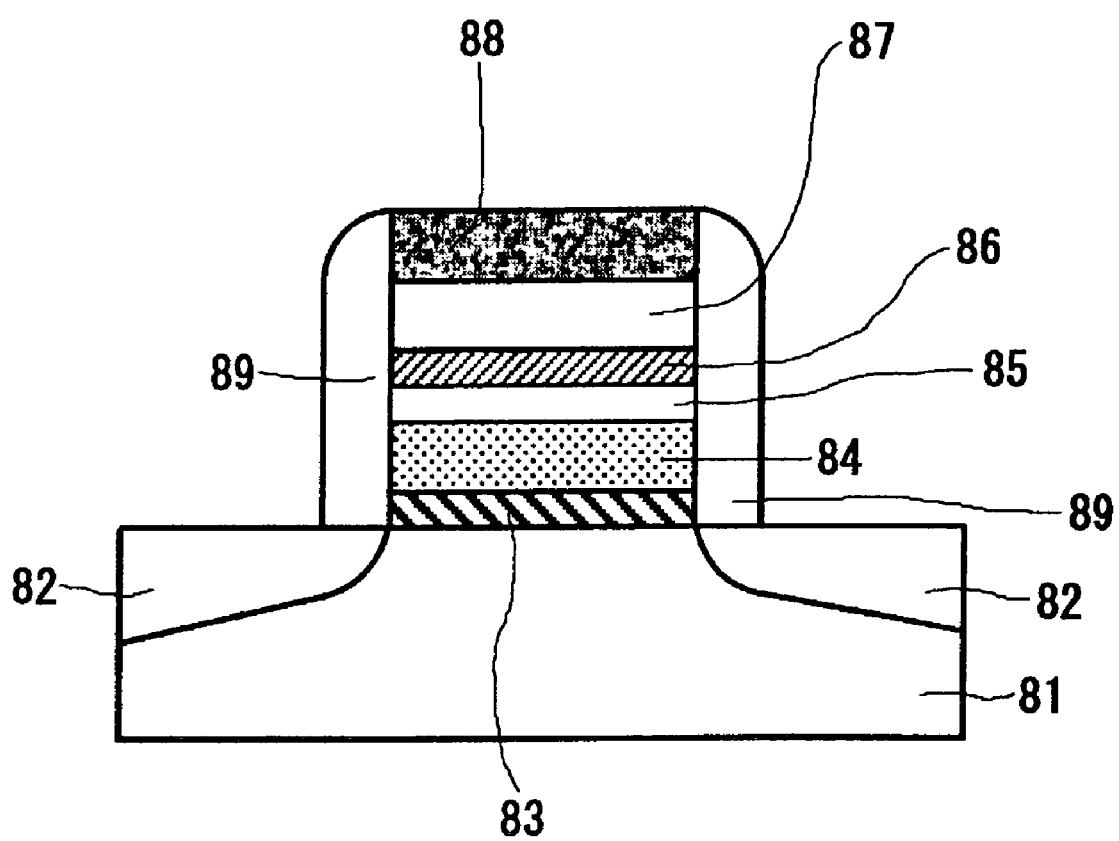
FIG. 14 is a schematic cross sectional view of a part of a memory cell in a nonvolatile semiconductor storage device according to the fifth embodiment of the invention.

As shown in FIG. 14, on a channel region along the surface of a p-type silicon substrate 81 of single crystal silicon, for example, between source/drain regions 82, 82, a silicon oxide film 84 containing buried silicon fine particles is formed as the first floating gate electrode via a tunneling oxide film 83 having a thickness around 5 nm formed by thermal oxidation. The silicon oxide film 84 is a film having a thickness around 10 nm and a non-stoichiometric composition. It is stacked by, for example, CVD. On the silicon oxide film 84 containing buried silicon fine particles, a silicon nitride film 86 having the thickness of approximately 5 nm is stacked as the second floating gate electrode via a 5 nm thick silicon oxide film 85 as an isolation film. In this multi-layered structure, the silicon oxide film 84 and the silicon nitride film 86 are material layers different in carrier trapping efficiency. Further formed on the silicon nitride film 86 is an electrode layer as the control electrode via a silicon oxide film 87 of a thickness around 10 nm. The electrode layer 88 is used to apply the writing voltage or erasing voltage to the substrate 81 or source/drain regions 82, 82. It is formed by patterning a polycrystalline silicon layer, for example. However, a tungsten silicide film may be formed alternatively.

For manufacturing the nonvolatile semiconductor storage device according to the instant embodiment, device isolation of the p-type silicon substrate 81 is first carried out by LOCOS. The source/drain regions 82, 82 are formed by first forming a gate portion on the surface of the silicon substrate 81 and then forming the source/drain regions 82, 82 in self alignment with the gate electrode by, for example, ion implantation of an n-type dopant such as phosphorus or arsenic. The surface portion of the silicon substrate 81 between the source/drain regions 82, 82 is used as the channel region. On side surfaces from the electrode layer 88 formed by a gate pattern process to the tunneling oxide film 24, side walls 89, 89 are formed by forming silicon oxide films by CVD of the entire surface and then etching them by RIE (reactive ion etching). Although not shown, openings are formed in the source/drain regions 22, 23 to extract the electrodes.

Figure 15:
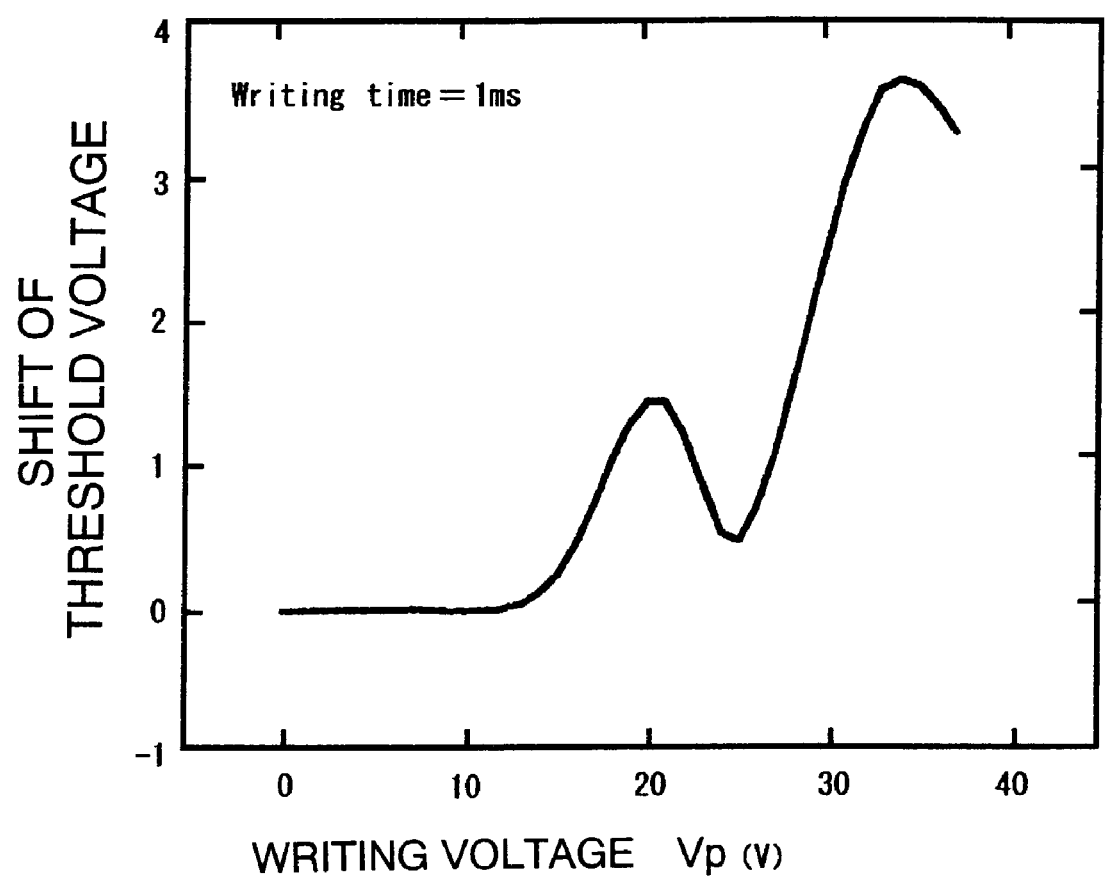
FIG. 15 is a graph showing the characteristics of a threshold voltage relative to the writing voltage in the nonvolatile semiconductor storage device according to the fifth embodiment of the invention.
Figure 16:
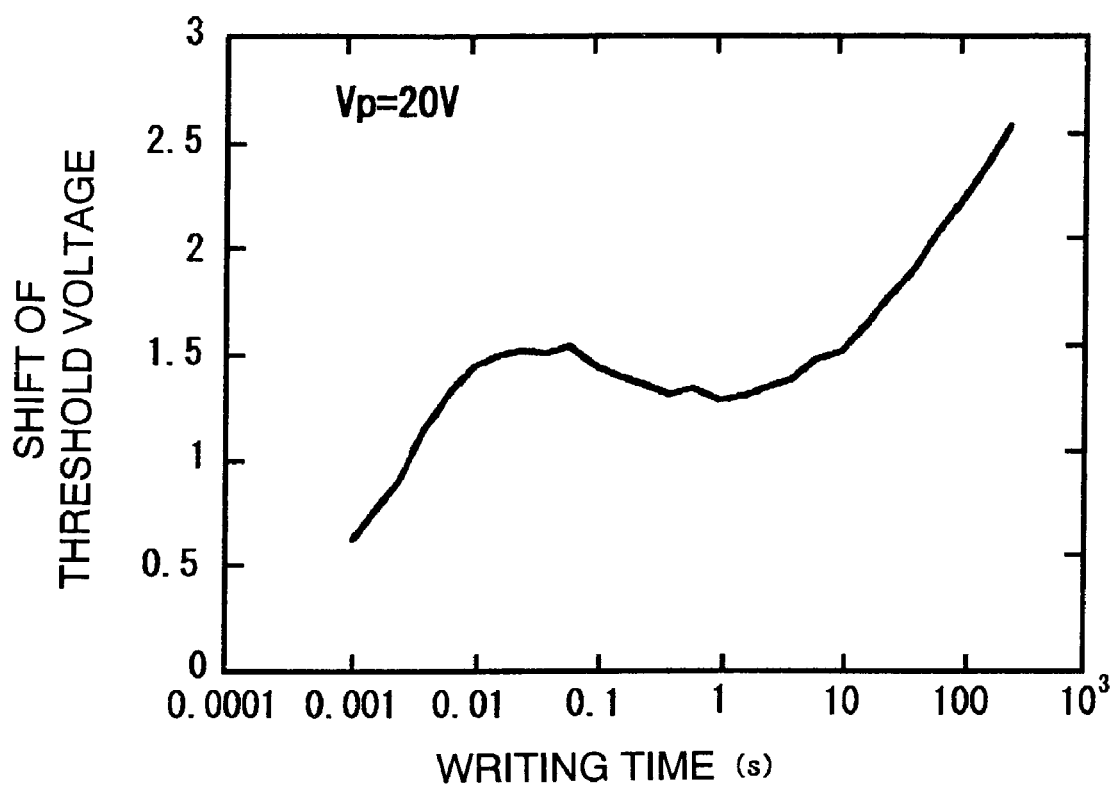
FIG. 16 is a graph showing the characteristics of the threshold voltage relative to the writing time in the nonvolatile semiconductor storage device according to the fifth embodiment of the invention.

In the nonvolatile semiconductor storage device having the above-explained structure according to the instant embodiment, the silicon oxide film 84 having a non-stoichiometric composition and the silicon nitride film 86 are used as at least two materials of the floating gate electrode different in carrier trapping efficiency, and there are obtained the characteristics of the shift amount of the threshold voltage relative to the writing voltage as shown in FIG. 15 and the characteristics of the shift amount of the threshold voltage relative to the writing time as shown in FIG. 16. FIG. 15 is a diagram showing the shift amount of the threshold voltage relative to the writing voltage in the writing time of 1 ms. FIG. 16 is a diagram showing the shift amount of the threshold voltage relative to the writing time under the writing voltage of 20 V. In the characteristics of the shift amount of the threshold voltage relative to the writing voltage, when the writing voltage becomes near from 15V to 20V as shown in FIG. 15, the shift amount of the threshold voltage suddenly increases, and reaches the shift amount of approximately 2V. However, there appears a region where the shift amount of the threshold voltage rather decreases thereafter up to the writing voltage of approximately 22V. In the region where the writing voltage exceeds about 22V, the shift amount of the threshold voltage increases as the writing voltage rises. That is, in the nonvolatile semiconductor storage device according to the instant embodiment, there exists a region where the threshold voltage rather decreases relative to changes of the writing voltage.

In the characteristics of the shift amount of the threshold voltage relative to the writing time, until the writing time exceeds 0.01 second approximately as shown in FIG. 16, the shift amount of the threshold voltage increases substantially linearly as the writing time increases. After the writing time exceeds 0.01 second, until it reaches the range of 1 second approximately, the shift amount of the threshold voltage relative to the writing time does not increase but rather decreases. Then, in the range where the writing time exceeds one second approximately, the shift amount of the threshold voltage again increases. In this manner, in the behaviors relative to the writing time, there exists a region where the threshold voltage changes with a minus gradient, that is, where the threshold voltage decreases, as one form of regions without so much changes of the threshold voltage.

Figure 17A:
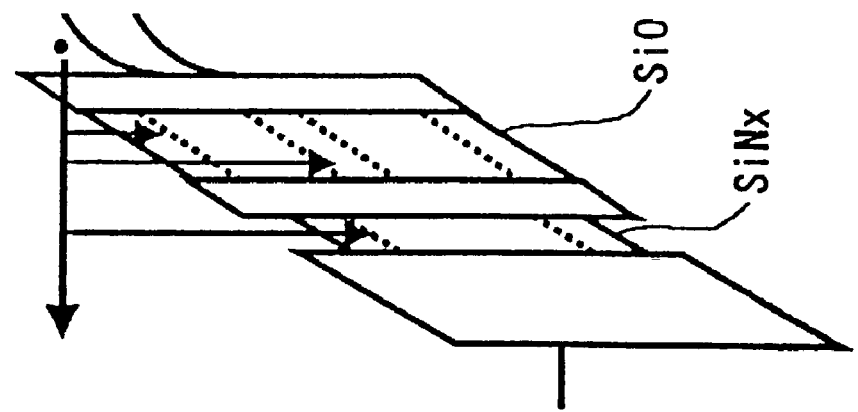
FIG. 17A shows that under a low writing voltage.
Figure 17B:
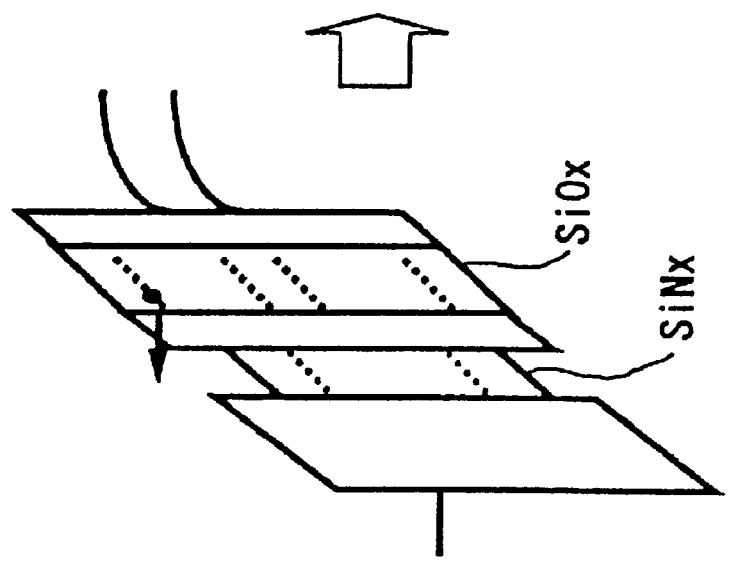
FIG. 17B shows that under an intermediate writing voltage.
Figure 17C:
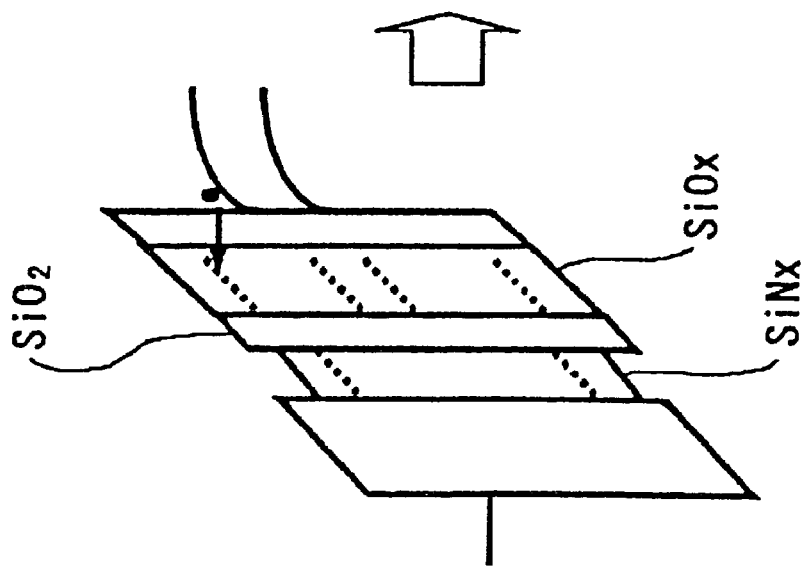
FIG. 17C shows that under a high writing voltage.

Figures labeled 17 are potential diagrams for hypothetically explaining behaviors of the nonvolatile semiconductor storage device according to the instant embodiment. FIGS. 17A through 17C illustrate energy potentials responsive to sequentially raised valued of the writing voltage. As shown in FIG. 17A, under the condition where the writing voltage is low, electrons tunnel through the tunneling oxide film 83, and are trapped by the shallow trap level of the silicon oxide film 84 ($SiO_x$) containing buried silicon fine particles, which is the first floating gate electrode. At that time, in the instant embodiment having the silicon oxide film 84 ($SiO_2$) interposed as an isolation film, electrons are less liable to move from the shallow trap level of the silicon oxide film 84 to the silicon nitride film 86 ($SiN_x$) as the next second floating gate electrode. When the writing voltage is raised as shown in FIG. 17B, electrons written by the first tunneling move to the silicon nitride film 86 as the second floating gate electrode while tunneling the silicon oxide film 85 as the isolation film, and function to decrease the threshold voltage. When the writing voltage is further raised as shown in FIG. 17C, electrons flowing from the channel toward the gate increase almost exponentially due to the Fowler-Nordheim current, and the threshold voltage also increases proportionally.

As explained above, in the nonvolatile semiconductor storage device according to the instant embodiment, there is a range where the threshold voltage rather decreases in case the writing voltage is raised on. The region where the threshold voltage decreases can be used as a margin for writing. As a result, reliable writing is ensured without accurate control of the writing voltage, and it contributes to simplifying the configuration of the verify circuit and to realization of substantially high-speed writing.

As described above, in the nonvolatile semiconductor storage device according to the invention, a region with almost no changes of the threshold voltage, which is produced by two or more kinds of materials different in carrier trapping efficiency, can be used as an operation margin during writing. Therefore, reliable writing is carried out without accurate control of the writing voltage, and it results in simplifying the configuration of the verify circuit and realization of substantially high-speed writing.

In addition, the use of the multi-layered structure as the layers forming the material layers different in carrier trapping efficiency contributes to eliminating differences in size among the material layers and to further stabilizing operations of memory cells.

| DESCRIPTION OF REFERENCE NUMERALS | |
|---|---|
| 1 | SUBSTRATE |
| 2, 24, 62, 83 | TUNNELING OXIDE FILM |
| 3, 5, 27, 64, 85 | SILICON OXIDE FILM |
| 4, 28, 48, 66, 86 | SILICON NITRIDE FILM |
| 6 | CONTROL GATE ELECTRODE |
| 7 | FLOATING GATE ELECTRODE |
| 21 | SEMICONDUCTOR SUBSTRATE |
| 22 | SOURCE REGION |
| 23 | DRAIN REGION |
| 26, 46 | POLYCRYSTALLINE SILICON FILM |
| 30, 50 | CONTROL ELECTRODE |
| 41 | INSULATING SUBSTRATE |
| 42 | THIN FILM SEMICONDUCTOR LAYER |
| 61, 81 | SILICON SUBSTRATE |
| 65 | SILICON FINE PARTICLES |
| 84 | SILICON OXIDE FILM OF NON-STOICHIOMETRIC COMPOSITION |

The invention claimed is:

1. A nonvolatile semiconductor storage device operatively configured for accumulating carriers in a floating gate electrode on a substrate, wherein:
   said carriers change the threshold voltage such that the threshold voltage exhibits a nonlinear change including an inflection point in response to at least one of the writing voltage or the writing time, and thereby eliminate the need to accurately control the writing voltages;
   said floating gate electrode comprises at least two kinds of materials with different carrier trapping efficiency to store data; and
   said floating gate electrode includes a silicon oxide film having fine silicon grains and a carrier trapping cross-sectional area not larger than $10^{-18} cm^2$ and a silicon nitride film having a carrier trapping cross-sectional area not smaller than $10^{-12} cm^2$.

2. A nonvolatile semiconductor storage device operatively configured for accumulating carriers in a floating gate electrode on a substrate, wherein:
   said carriers change the threshold voltage such that the threshold voltage exhibits a nonlinear change including an inflection point in response to at least one of the writing voltage or the writing time, and thereby eliminate the need to accurately control the writing voltages;
   said floating gate electrode comprises at least two kinds of materials with different carrier trapping efficiency to store data;
   said floating gate electrode includes a silicon oxide film having fine silicon grains and
   a carrier trapping cross-sectional area not larger than $10^{-18} cm^2$ and located nearer to a carrier generation region; and
   said floating gate electrode includes a film having a carrier trapping cross-sectional area not smaller than $10^{-12} cm^2$ and located further from said carrier generating region than said silicon oxide film.

3. A nonvolatile semiconductor storage device for storing data in a floating gate electrode by accumulating carriers in the floating gate electrode and thereby changing the threshold voltage, characterized in that the threshold voltage exhibits a nonlinear change including an inflection point in response to at least one of the writing voltage or the writing time, and
   said floating gate electrode includes a silicon oxide film having fine silicon grains and a carrier trapping cross-sectional area not larger than $10^{-18} cm^2$ and a film having a carrier trapping cross-sectional area not smaller than $10^{-12} cm^2$.

4. The nonvolatile semiconductor storage device according to claim 3 wherein said floating gate electrode is formed via an insulating film on a structure including a thin-film semiconductor layer on an insulating substrate, or formed on a semiconductor substrate via an insulating film.

5. The nonvolatile semiconductor storage device according to claim 3 wherein said floating gate electrode is made of at least two kinds of materials different in carrier trapping efficiency.

6. The nonvolatile semiconductor storage device according to claim 5 wherein said floating gate electrode is a combination of at least two of a polycrystalline silicon film, amorphous silicon film, silicon nitride film, silicon oxide film, silicon germanium film, any of those films containing fine particles of silicon, germanium or silicon germanium, or any film of a non-stoichiometric composition of those elements.

7. The nonvolatile semiconductor storage device according to claim 5 wherein said floating gate electrode is a combination of a silicon oxide film having a carrier trapping cross-sectional area not larger than $10^{-18} cm^2$ and a silicon nitride film having a carrier trapping cross-sectional area not smaller than $10^{-12} cm^2$.

8. The nonvolatile semiconductor storage device according to claim 5 wherein said floating gate electrode includes a film having a carrier trapping cross-sectional area not larger than $10^{-18} cm^2$ and located nearer to a carrier generation region, and a film having a carrier trapping cross-sectional are not smaller than $10^{-12} cm^2$ and located further from said carrier generating region.

9. The nonvolatile semiconductor storage device according to claim 5 wherein said floating gate electrode can store more states than two values.

10. A nonvolatile semiconductor storage device comprising an isolation film in a floating gate electrode on a substrate, wherein:
said isolation film isolates at least two kinds of materials with different carrier trapping efficiency in order to accumulate carriers in said floating gate electrode and store data therein;
said floating gate electrode includes a silicon oxide film having fine silicon grains and a non-stoichiometric composition with a carrier trapping cross-sectional area not larger than $10^{-18} cm^2$ and a silicon nitride film with a carrier t rapping cross-sectional area not smaller than $10^{-12} cm^2$; and
said isolation film is a silicon oxide film.

11. The nonvolatile semiconductor storage device according to claim 1 wherein said floating gate electrode is formed via an insulating film on a structure including a thin-film semiconductor layer on an insulating substrate, or formed on a semiconductor substrate via an insulating film.

12. The nonvolatile semiconductor storage device according to claim 2 wherein said floating gate electrode is formed via an insulating film on a structure including a thin-film semiconductor layer on an insulating substrate, or formed on a semiconductor substrate via an insulating film.

13. The nonvolatile semiconductor storage device according to claim 1 wherein said floating gate electrode is a combination of at least two of a polycrystalline silicon film, amorphous silicon film, silicon nitride film, silicon oxide film, silicon germanium film, any of those films containing fine particles of silicon, germanium or silicon germanium, or any film of a non-stoichiometric composition of those elements.

14. The nonvolatile semiconductor storage device according to claim 2 wherein said floating gate electrode is a combination of at least two of a polycrystalline silicon film, amorphous silicon film, silicon nitride film, silicon oxide film, silicon germanium film, any of those films containing fine particles of silicon, germanium or silicon germanium, or any film of a non-stoichiometric composition of those elements.

15. The nonvolatile semiconductor storage device according to claim 1 wherein said floating gate electrode has a structure stacking at least two kinds of material films different in carrier trapping efficiency.

16. The nonvolatile semiconductor storage device according to claim 2 wherein said floating gate electrode has a structure stacking at least two kinds of material films different in carrier trapping efficiency.

17. The nonvolatile semiconductor storage device according to claim 1 wherein said floating gate electrode can store more states than two values.

18. The nonvolatile semiconductor storage device according to claim 2 wherein said floating gate electrode can store more states than two values.

* * * * *